(12) United States Patent
Aokura et al.

(10) Patent No.: US 6,176,980 B1
(45) Date of Patent: Jan. 23, 2001

(54) SPUTTERING METHOD AND APPARATUS

(75) Inventors: Isamu Aokura, Osaka; Teiichi Kimura, Itami; Hiroshi Hayata, Hirakata; Masahiro Yamamoto, Osaka; Nobuyuki Mori, Yao, all of (JP)

(73) Assignee: Matsushita Electric Industrial Co., Ltd., Osaka-Fu (JP)

( * ) Notice: Under 35 U.S.C. 154(b), the term of this patent shall be extended for 0 days.

(21) Appl. No.: 09/471,509

(22) Filed: Dec. 23, 1999

(30) Foreign Application Priority Data

Dec. 28, 1998 (JP) .................................. 10-371931

(51) Int. Cl.[7] ................................... C23C 14/34
(52) U.S. Cl. ................. 204/192.12; 204/298.07; 204/298.33
(58) Field of Search .......... 204/192.12, 298.07, 204/298.33

(56) References Cited

U.S. PATENT DOCUMENTS 5,716,500 * 2/1998 Bardos et al. ............... 204/192.12
5,976,334 * 11/1999 Fu et al. ........................ 204/298.19
5,997,699 * 12/1999 Leiphart ........................ 204/192.3

OTHER PUBLICATIONS

Posadowski et al., "Sustained self–sputtering using a direct current magnetron source", J. Vac. Sci. Technol. A 11(6), 2980–2984, Dec. 1993.*

Briesacher et al. "Advanced Semiconductor Manufacturing", Nov. 1989.*

* cited by examiner

Primary Examiner—Nam Nguyen
Assistant Examiner—Steven H. Versteeg
(74) Attorney, Agent, or Firm—Price and Gess

(57) ABSTRACT

The film thickness of a thin film formed on substrate 14 is made symmetrical and uniform by eliminating currents of gas over target 9 by performing film deposition in a condition with gas supply and vacuum evacuation cut off, after adjusting the interior of vacuum chamber 1 to the predetermined pressure.

5 Claims, 5 Drawing Sheets

SPUTTERING METHOD AND APPARATUS

BACKGROUND OF THE INVENTION

1. Field of the Invention

The present invention relates to a sputtering method such as a magnetron sputtering method, which is one technique for forming thin films.

2. Description of Prior Art

The sputtering method is a method whereby a thin film is formed by generating a plasma, typically by creating a gaseous discharge in a low-vacuum atmosphere, making positive ions of the plasma collide with a target arranged on a negative electrode called a sputtering electrode, and thereby depositing sputtered particles produced by the collision on the substrate. This sputtering method is widely used in film deposition steps since it enables composition to be controlled and operation of the apparatus is comparatively simple.

FIG. 5 shows the layout of a prior art magnetron sputtering apparatus. In FIG. 5, a vacuum chamber 101 has an evacuation port 102 from which vacuum chamber 101 is evacuated by a vacuum pump (not shown). The evacuation port 102 has a main valve 104, and a moveable valve 103 whereby the evacuation conductance can be adjusted. The vacuum chamber 101 further has a gas introduction pipe 105 and a gas flow rate controller 106 mounted on gas introduction pipe 105. Electrical discharge gas 107 is introduced into vacuum chamber 101 from gas introduction pipe 105; usually, argon gas is employed. 108 is a gas introduction valve.

A target 109 is held on a sputtering electrode 110, that is connected to a discharge power source 111 and is provided with a magnet 112 arranged at the back face of target 109. A substrate 114 on which a thin film is formed is placed on a substrate holder 113 opposite the substrate electrode 110. An insulator 116 is mounted so as to isolate sputtering electrode 110 from vacuum chamber 101.

Operation of the sputtering apparatus constructed as above will now be described. First of all, the interior of vacuum chamber 101 is evacuated to about $10^{-7}$ Torr by means of a vacuum pump from evacuation port 102. Next, discharge gas 107 is introduced into vacuum chamber 101 through gas introduction pipe 105 that is connected to one end of vacuum chamber 101, while the pressure within vacuum chamber 101 is maintained at about $10^{-3}$ to $10^{-2}$ Torr. When negative voltage or high-frequency voltage is applied by DC or high-frequency discharge power source 111 to sputtering electrode 110 on which target 109 is mounted, by the action of the electric field produced by discharge power source 111 and the magnetic field produced by magnet 112 arranged at the back face of target 109, a ring-shaped plasma is produced by the discharge in the vicinity of the front face of target 109, giving rise to the sputtering phenomenon. The thin film is thus formed on substrate 114 arranged on substrate holder 113 by the sputtered particles that are discharged from target 109.

However, in the conventional arrangement described above, since gas introduction into vacuum chamber 101 and evacuation from vacuum chamber 101 are both performed during the formation of the thin film, the pressure on the front face of target 109 becomes uneven. As a result, the distribution of sputtered particles discharged from target 109 is uneven, giving rise to the problem that the thickness of the thin film formed on substrate 114 cannot be made uniform.

SUMMARY OF THE INVENTION

The present invention was made in view of the above problems of the prior art, its object being to provide a sputtering method and apparatus whereby the film thickness on the surface of the substrate can be made uniform and symmetric.

In a sputtering method according to a first aspect of the present invention, a thin film is formed in a condition with the introduction of gas into the vacuum chamber cut off and evacuation of gas from the vacuum chamber cut off.

Thus, non-uniformity of pressure produced by gas currents within the vacuum chamber during thin film formation is eliminated, enabling the thin film deposited on the substrate to be made of uniform and symmetric film thickness.

In a sputtering method according to a second aspect of the present invention, a thin film is formed on a substrate whilst alternating between a condition in which deposition is effected with introduction of gas into the vacuum chamber cut off and evacuation from the vacuum chamber cut off and a condition in which gas is introduced into the vacuum chamber and evacuated from the vacuum chamber.

The same benefits as the first aspect of the invention can therefore be obtained and, in addition, symmetry of film thickness is ensured and stability of film properties is ensured even when the reactive sputtering method is employed or the film deposition time is long.

A sputtering apparatus according to the present invention comprises a controller for effecting opening and closing control of the main valve of the evacuation port and the gas introduction valve of the gas introduction pipe such that the main valve and the gas introduction valve are opened and closed at the same time during film deposition. The merits of the methods pertaining to the first and second aspects of the present invention can be made evident through the use of preferred embodiments.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS (First Embodiment)

A first embodiment of a sputtering method according to the present invention is described below with reference to FIG. 1 to FIG. 3.

Figure 1:
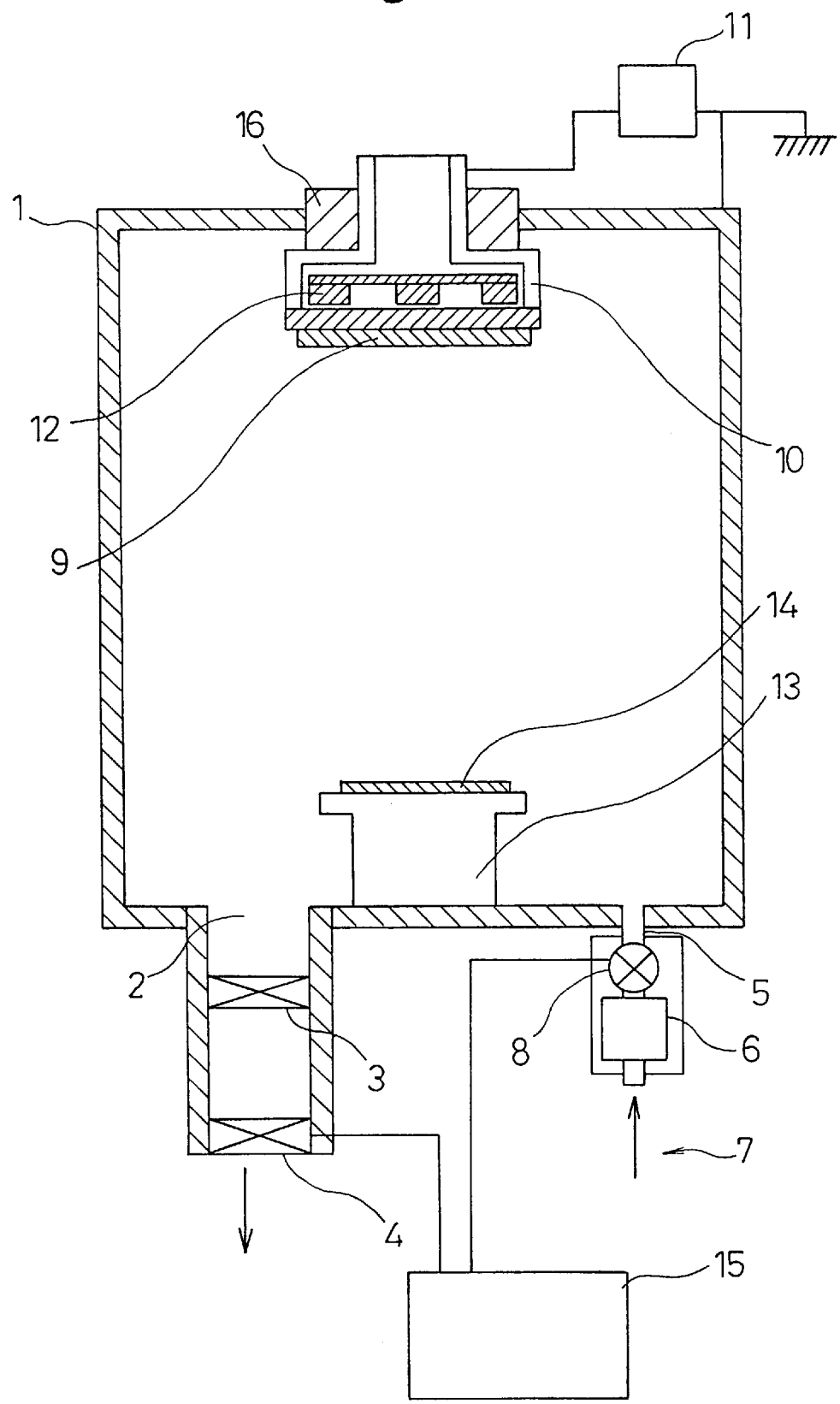
FIG. 1 is an axial cross-sectional view showing a diagrammatic layout of a sputtering apparatus for implementing a sputtering method according to a first embodiment of the present invention.

In FIG. 1, a vacuum chamber 1 has a vacuum evacuation port 2 connected to a vacuum pump (not shown). A main valve 4 that opens and closes vacuum evacuation port 2 and moveable valve 3 that adjusts the evacuation conductance are provided at vacuum evacuation port 2. The vacuum chamber 1 further has a gas introduction pipe 5 and a gas flow rate controller 6 provided on gas introduction pipe 5.

Discharge gas 7, usually argon gas, is introduced into vacuum chamber 1 from gas introduction pipe 5. A gas introduction valve 8 opens and closes gas introduction pipe 5.

A target 9 is supported on a sputtering electrode 10, that is mounted in vacuum chamber 1 by means of insulator 16. A discharge power source 11 applies negative voltage or high frequency voltage to sputtering electrode 10. A magnet 12 is arranged at the back face of target 9 within vacuum chamber 1. A substrate holder 13 is arranged at a position facing target 9 within vacuum chamber 1. A substrate 14 is held on a substrate holder 13, the thin film being formed thereon. Furthermore, a control device 15 is provided, that effects opening/closing control in approximately synchronized manner of main valve 4 and gas introduction valve 8 during film deposition.

Figure 2:
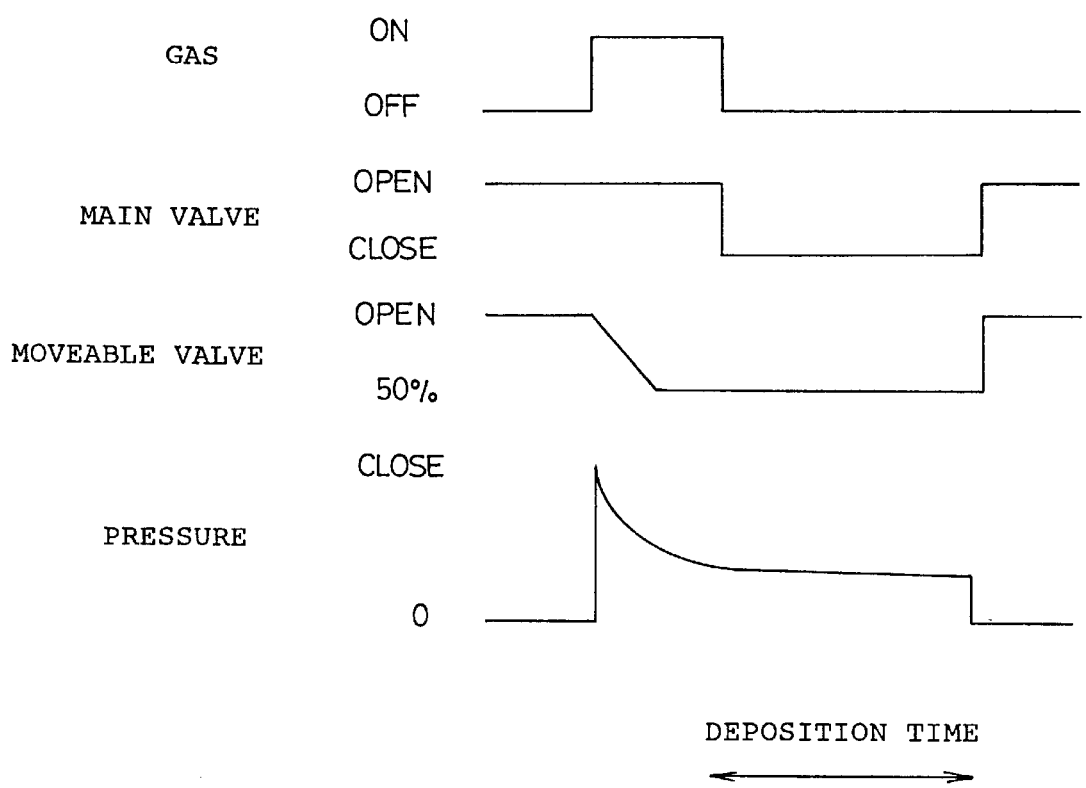
FIG. 2 is a timing chart in this embodiment.

FIG. 2 is a timing chart showing the pressure within vacuum chamber 1 together with the operation of gas introduction valve 8, main valve 4 and moveable valve 3 when forming a thin film using the sputtering apparatus shown in FIG. 1.

As shown in the drawings, in a condition with main valve 4 and moveable valve 3 opened, vacuum chamber 1 is evacuated to about $10^{-7}$ Torr and gas introduction valve 8 is then opened, thereby introducing discharge gas 7 into vacuum chamber 1 at a predetermined flow rate, using gas flow rate controller 6. Next, adjustment to the predetermined pressure within vacuum chamber 1 is effected by means of moveable valve 3.

Next, main valve 4 and gas introduction valve 8 are simultaneously closed by means of control device 15, after which power is applied to the sputtering electrode 10 practically simultaneously by means of power source 11, thereby forming a plasma on the target 9 and forming a thin film on substrate 14.

Figure 3:
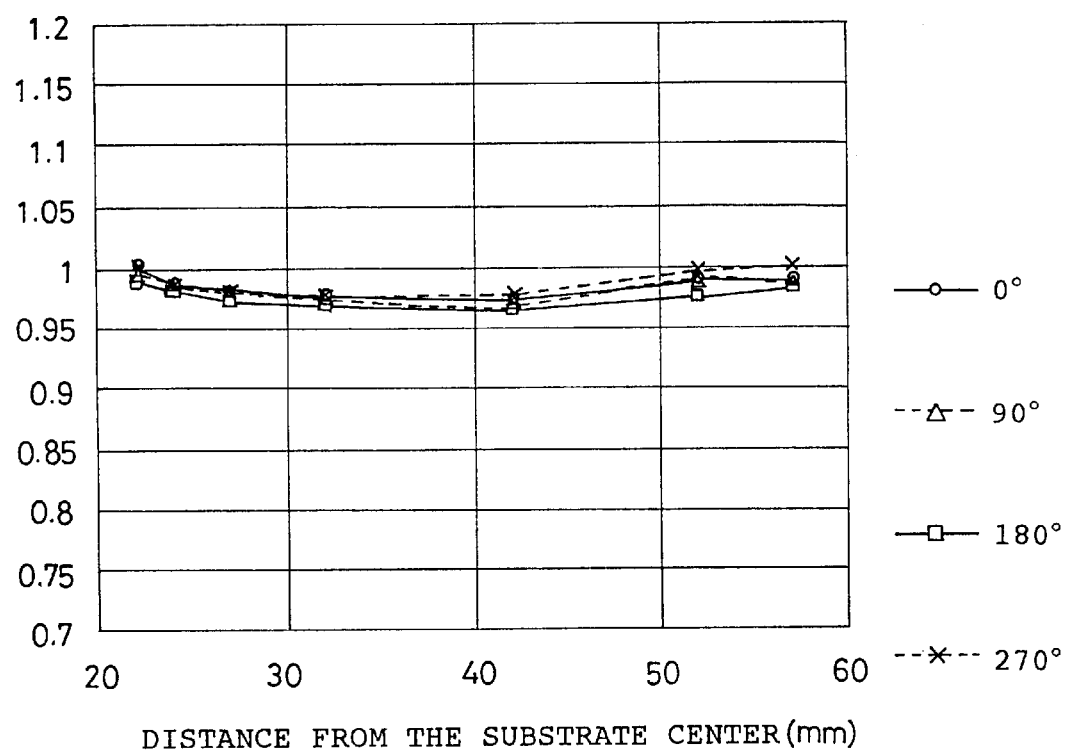
FIG. 3 a view of the film thickness distribution of a substrate in this embodiment.

FIG. 3 shows the results of measurement of film thickness when a thin film was formed by the above method. Substrate 14 is disc-shaped and the normalized results of measuring the film thickness at fixed distance intervals in the radial direction from its center at intervals of 90° are shown. As shown in the Figure, an approximately symmetric, uniform film thickness distribution is obtained.

As shown above, in this embodiment, the thickness of the thin film formed on substrate 14 can be made symmetrical by eliminating the non-uniformity of pressure produced by the gas flow within vacuum chamber 1 during thin film formation.

Although, in this embodiment, main valve 4 and gas introduction valve 8 were closed simultaneously, so long as the predetermined pressure can be ensured, there is no problem if this is not effected precisely simultaneously.

Also, although, in this embodiment, magnet 12 was arranged at the back face of target 9, it is not essential that this should be the back face. The same benefits can of course be obtained even if no magnet is provided.

(Second Embodiment)

Next, a second embodiment of the sputtering method of the present invention will be described with reference to FIG. 4.

Figure 4:
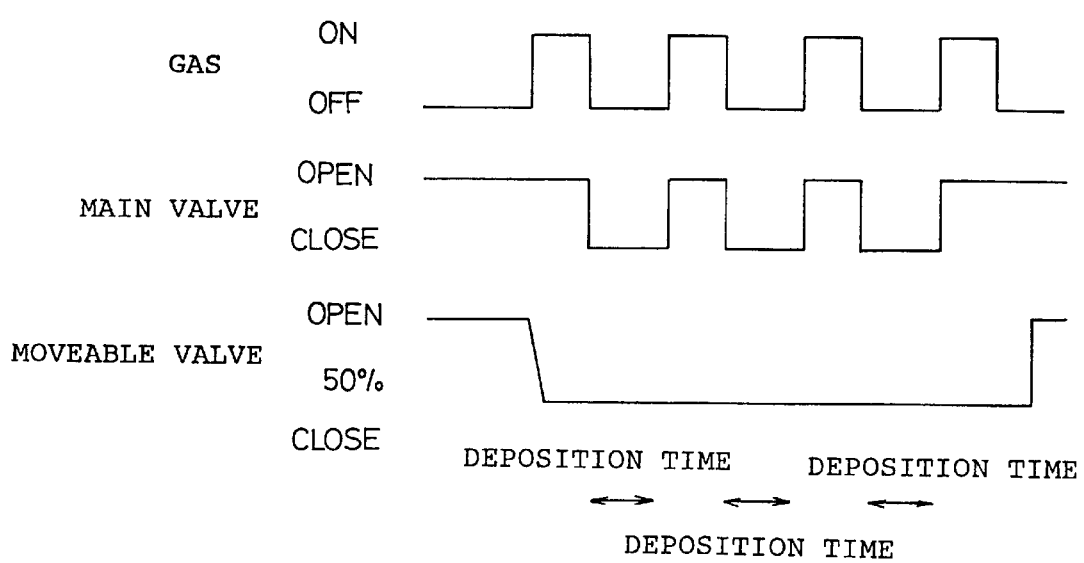
FIG. 4 is a timing chart of a method of sputtering in a second embodiment.
Figure 5:
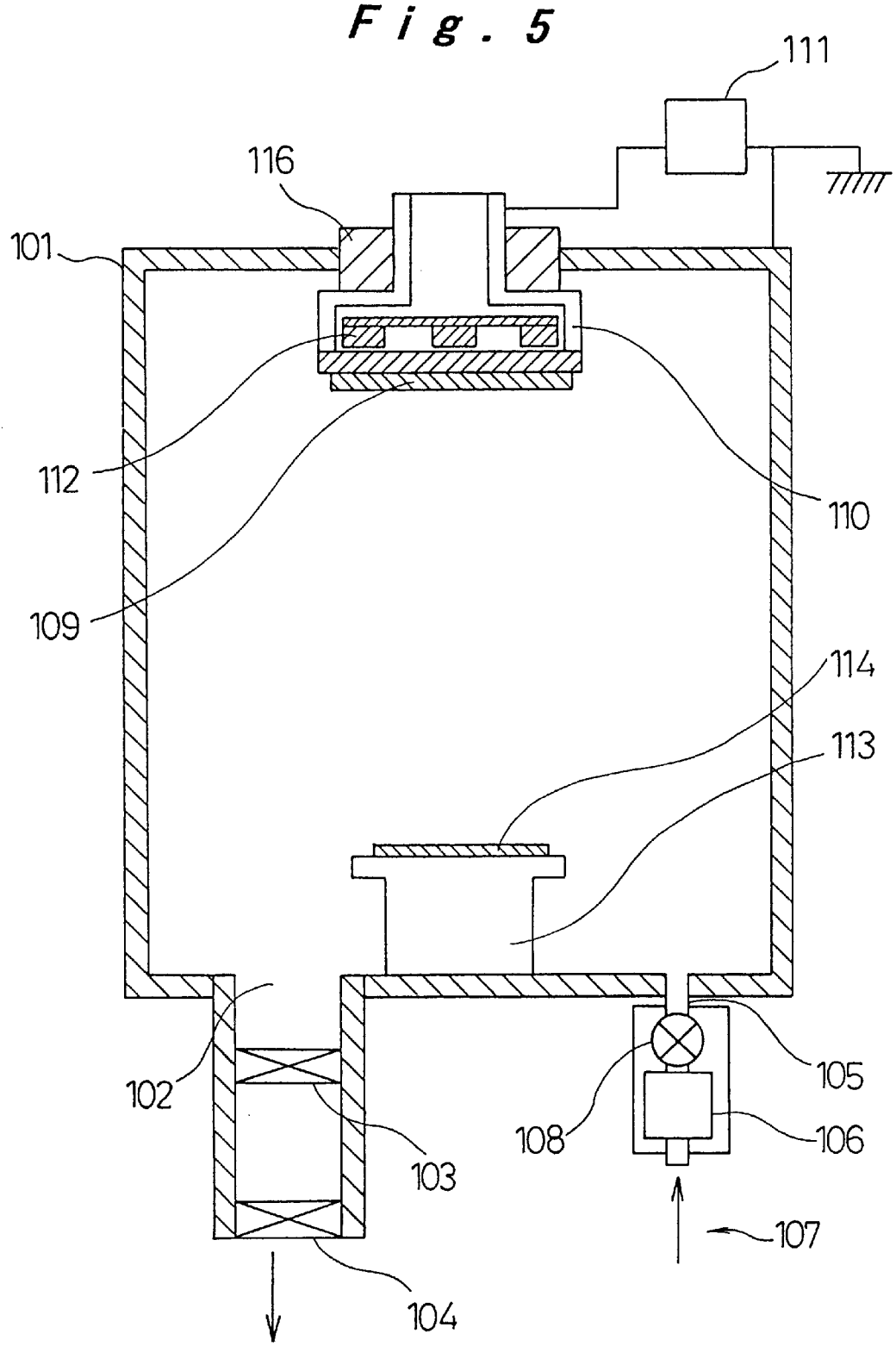
FIG. 5 is an axial cross-sectional view showing a diagrammatic layout of a prior art sputtering apparatus.

FIG. 4 is a timing chart of the operation of the various items of equipment in order to carry out the method of sputtering of this embodiment. The operation is generally the same as in the case of the first embodiment, the point of difference being that, during thin film formation, a condition in which film formation is performed with discharge gas 7 cut off by closing gas introduction valve 8 so that the discharge gas 7 is sealed into the vacuum chamber, and a condition in which discharge gas 7 is introduced by opening gas introduction valve 8 and the interior of vacuum chamber 1 is evacuated by opening main valve 4 are repeatedly alternated.

When the thin film is formed in a condition with the discharge gas 7 sealed into vacuum chamber 1, problems such as a lowering of partial pressure of the reactive gas or a lowering of film deposition pressure do not occur even when the reactive sputtering method is employed in which thin film is formed using as discharge gas 7 a mixture of argon gas and nitrogen gas or oxygen gas etc., or when the film thickness that is to be formed is large, with a discharge time of about 10 minutes or more, so there is no possibility of the stability of the film properties being impaired.

Consequently, this embodiment can provide the same benefits as the first embodiment and, in addition, makes it possible to ensure symmetry of film thickness and stability of film properties even when the reactive sputtering method is employed or the film deposition time is long.

Although, in this embodiment also, a magnet 12 was arranged at the back face of target 9, it is not essential that this should be the back face. Furthermore, the same benefits could of course be obtained even without the provision of a magnet.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A sputtering method wherein a thin film is formed on a substrate arranged opposite a target within a vacuum chamber by sputtering the target with ions in a plasma formed above a target surface, characterized in that the thin film is formed whilst alternating between a condition in which film deposition is effected with introduction of gas into the vacuum chamber cut off and evacuation from the vacuum chamber cut off and a condition in which gas is introduced into the vacuum chamber and evacuated from the vacuum chamber.

2. A sputtering method comprising the steps of:
   evacuating a vacuum chamber through an evacuation port in a condition with a main valve and a movable valve of the evacuation port both opened;
   introducing gas into the vacuum chamber through a gas introduction pipe by opening a gas introduction valve;
   adjusting pressure inside the vacuum chamber to a predetermined pressure by gradually closing the movable valve of the evacuation port;
   closing the main valve of the evacuation port and the gas introduction valve of the gas introduction pipe at the same time; and
   applying electric power to a sputtering electrode for forming plasma on a target, whereby a thin film is formed on a substrate held opposite the target.

3. A sputtering method comprising the steps of:
   evacuating a vacuum chamber through an evacuation port in a condition with a main valve and a movable valve of the evacuation port both opened;
   introducing gas into the vacuum chamber through a gas introduction pipe by opening a gas introduction valve;
   adjusting pressure inside the vacuum chamber to a predetermined pressure by gradually closing the movable valve of the evacuation port;
   closing the main valve of the evacuation port and the gas introduction valve of the gas introduction pipe at the same time;

applying electric power to a sputtering electrode for forming plasma on a target, whereby a thin film is formed on a substrate held opposite the target;

opening the main valve of the evacuation port and the gas introduction valve of the gas introduction pipe at the same time, whereby the vacuum chamber is evacuated while gas is introduced into the vacuum chamber; and repeating the simultaneous opening and closing of the main valve and the introduction pipe by a predetermined number of times, wherein film deposition is performed while both of the main valve and the introduction pipe are closed.

4. A sputtering apparatus comprising:

a vacuum chamber;

a substrate holder arranged within the vacuum chamber for supporting thereon a substrate;

a target provided opposite the substrate within the vacuum chamber;

an evacuation port whereby the vacuum chamber is evacuated to vacuum, the evacuation port being opened and closed with a main valve;

a gas introduction pipe whereby gas is introduced into the vacuum chamber, the gas introduction pipe being opened and closed with a gas introduction valve; and a controller for effecting opening and closing control of the main valve of the evacuation port and the gas introduction valve of the gas introduction pipe such that the main valve and the gas introduction valve are opened and closed at the same time during film deposition.

5. A method of sputtering an object with a uniform deposition of sputtered material in a sputtering chamber having an entrance port for introducing a gas to enable a sputtering operation and an exit port for removing the gas, the sputtering chamber forming a plasma above a target source to provide sputtered target material to the object, comprising the steps of;

(a) initially charging the sputtering chamber with gas at a predetermined pressure through the entrance port to enable a sputtering operation;

(b) closing the entrance port and the exit port to prevent any gas delivery and removal pressure effects to disturb the sputtering operation;

(c) starting the sputtering operation to provide sputtered target material on the object;

(d) stopping the sputtering operation;

(e) opening the entrance port and the exit port;

(f) charging the sputtering chamber again with gas at a predetermined pressure through the entrance port to enable a sputtering operation;

(g) closing the entrance port and the exit port; and (h) starting the sputtering operation to deposit a second layer of the same sputtered material on the object.

* * * * *